United States Patent [19]
Belcher et al.

[11] Patent Number: 5,436,450
[45] Date of Patent: * Jul. 25, 1995

[54] INFRARED DETECTOR LOCAL BIASING STRUCTURE AND METHOD

[75] Inventors: James F. Belcher, Plano; Robert A. Owen, Rowlett; Charles M. Hanson; Howard R. Beratan, both of Richard, all of Tex.

[73] Assignee: Texas Instruments Incorporated, Dallas, Tex.

[*] Notice: The portion of the term of this patent subsequent to Jun. 20, 2012 has been disclaimed.

[21] Appl. No.: 182,268

[22] Filed: Jan. 13, 1994

[51] Int. Cl.$^6$ ................................................ G01J 5/06
[52] U.S. Cl. ..................................... 250/332; 250/338.2
[58] Field of Search ....................... 250/332, 352, 338.2, 250/338.3, 349, 370.08

[56] References Cited

U.S. PATENT DOCUMENTS

| | | | |
|---|---|---|---|
| 3,962,578 | 6/1976 | Roschen | 250/226 |
| 4,085,500 | 4/1978 | Hager et al. | 29/589 |
| 4,411,732 | 10/1983 | Wotherspoon | 156/643 |
| 4,447,291 | 5/1984 | Schulte | 156/643 |
| 4,614,957 | 9/1986 | Arch et al. | 357/16 |
| 4,639,756 | 1/1987 | Rosbeck et al. | 357/30 |
| 4,684,812 | 8/1987 | Tew et al. | 250/578 |
| 4,740,700 | 4/1988 | Shaham et al. | 250/332 |
| 4,948,976 | 8/1990 | Baliga et al. | 250/370.06 |
| 4,965,649 | 10/1990 | Zanio et al. | 357/301 |
| 5,113,076 | 5/1992 | Schulte | 250/370.06 |
| 5,144,138 | 9/1992 | Kinch et al. | 250/332 |
| 5,188,970 | 2/1993 | York et al. | 437/3 |

Primary Examiner—Carolyn E. Fields
Attorney, Agent, or Firm—Brian A. Carlson; James C. Kesterson; Richard L. Donaldson

[57] ABSTRACT

In an exemplary thermal imaging system (20, 120, 220 and 320), a thermal isolation structure (50 and 150) is disposed on an integrated circuit substrate (70 and 170) for electrically connecting and mechanically bonding a focal plane array (30 and 230) of thermal sensors (40 and 240). Each mesa-type structure (52, 54 and 152) includes at least one mesa conductor (56, 58, 156 and 158) that extends from the top of the mesa-type structure (52, 54 and 152) to an adjacent contact pad (72 and 74). The mesa conductors (56, 58, 156 and 158) provide both biasing voltage ($V_B$) for the respective thermal sensor (40 and 240) and a signal flow path ($V_S$) for the respective thermal sensor (40 and 240). The mesa conductors (56, 56, 156 and 158) may be used to provide biasing voltage ($V_B$) to either a single ferroelectric element (242) or a pair of ferroelectric elements (42 and 44). When the focal plane array (30 and 230) is bonded to the corresponding array of mesa-type structures (52, 54 and 152), a thermally isolated, but electrically conductive path is provided between electrodes (43 and 45) of the thermal sensor (40 and 240) and the corresponding contact pad (72 and 172) of the integrated circuit substrate (70 and 74).

20 Claims, 4 Drawing Sheets

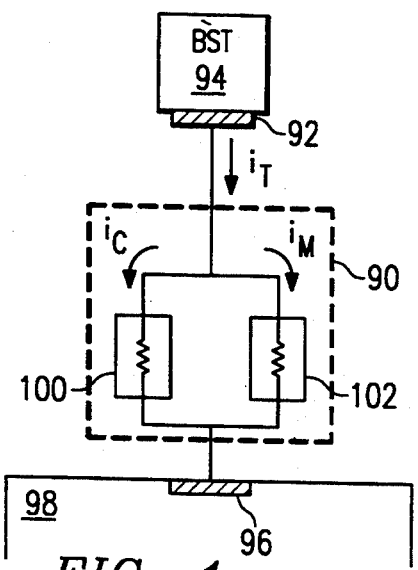
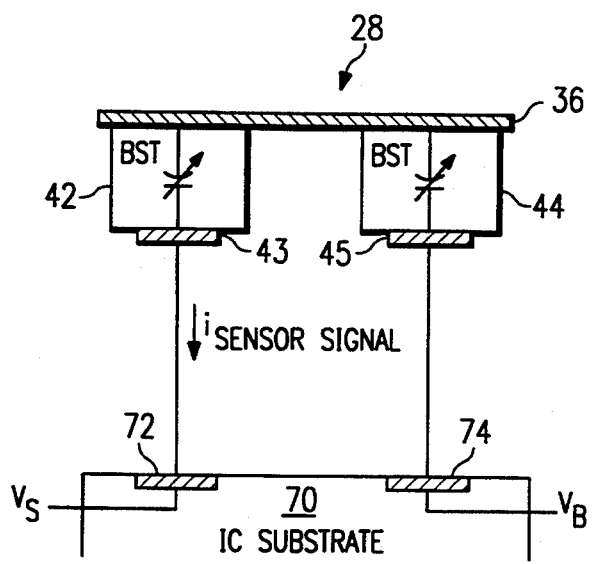
FIG. 1 (PRIOR ART)
FIG. 2
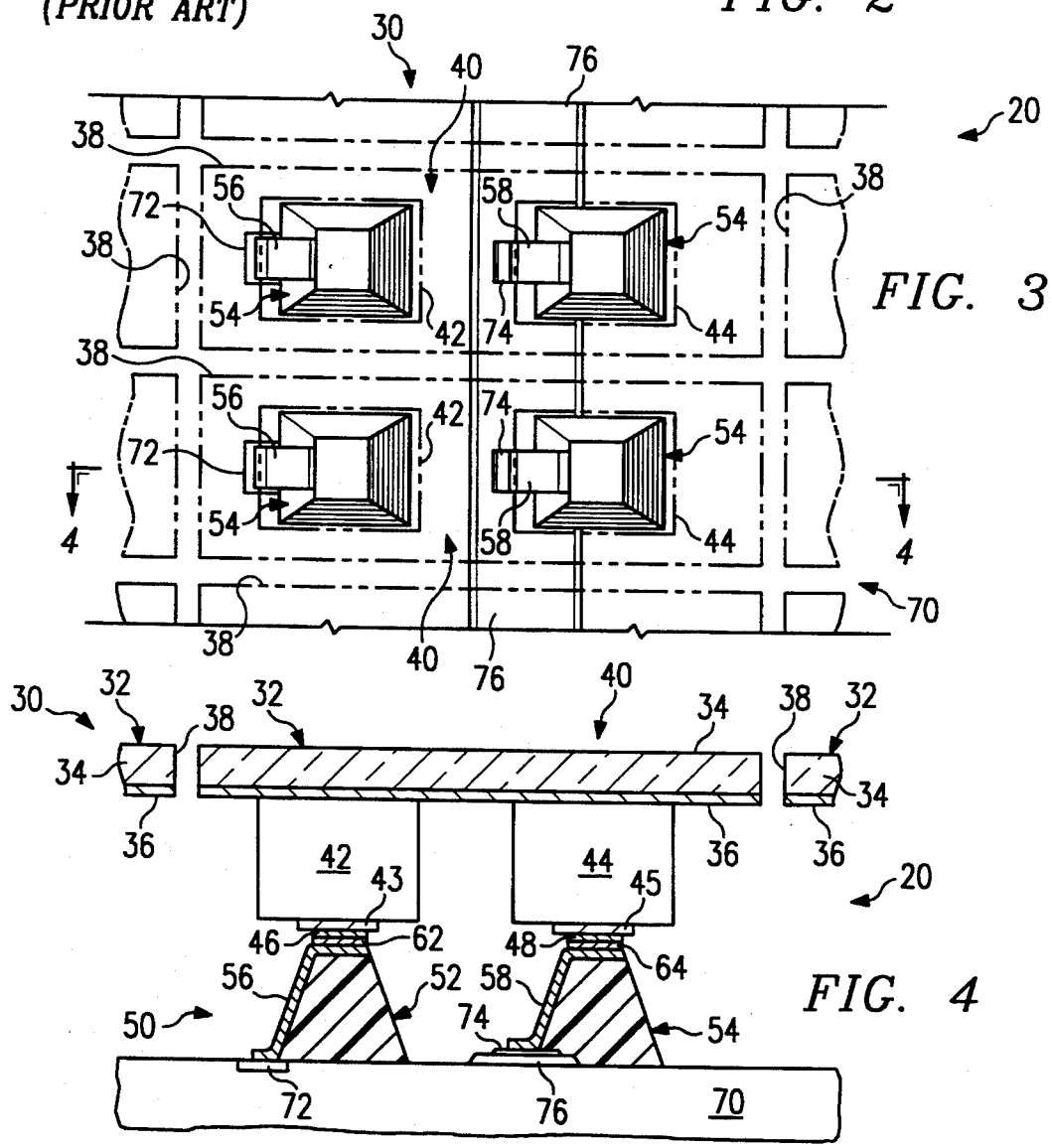
FIG. 3
FIG. 4

INFRARED DETECTOR LOCAL BIASING STRUCTURE AND METHOD

RELATED APPLICATIONS

This application is related to co-pending application Ser. No. 08/182,865, filed on Jan. 13, 1994, entitled "Infrared Detector and Method," of the same assignee.

TECHNICAL FIELD OF THE INVENTION

This invention relates to thermal isolation and signal flowpaths for hybrid solid state systems, and more particularly, to a thermal (infrared) imaging system having a mesa-type structure and method for providing mechanical and electrical bonds between a focal plane array of thermal sensors and an underlying integrated circuit substrate.

BACKGROUND OF THE INVENTION

One common application of thermal sensors is in thermal (infrared) imaging devices such as night vision equipment. One such class of thermal imaging devices includes a focal plane array of infrared detector elements or thermal sensors coupled to an integrated circuit substrate with a corresponding array of contact pads between the focal plane array and the integrated circuit substrate. The thermal sensors define the respective picture elements (or pixels) of the resulting thermal image.

One type of thermal sensor includes a ferroelectric or pyroelectric element formed from ferroelectric material which exhibits a state of electrical polarization dependent upon temperature changes in response to incident infrared radiation. An infrared absorber and common electrode are disposed on one side of the ferroelectric elements. A sensor signal electrode is disposed on the opposite side of each ferroelectric element. The infrared absorber and common electrode extend across the surface of the focal plane array and are attached to each of the ferroelectric elements. Each ferroelectric element generally has its own separate sensor signal electrode. Each infrared detector element or thermal sensor is defined in part by the infrared absorber and common electrode and the respective sensor signal electrode. The electrodes constitute capacitive plates and the ferroelectric element constitutes a dielectric or insulator disposed between the capacitive plates.

Thermal isolation structures are typically disposed between the focal plane array and the integrated circuit substrate to provide both mechanical bonding and a sensor signal flowpath while minimizing thermal diffusion from the respective thermal sensors to the integrated circuit substrate. Several approaches have been used to provide such thermal isolation structures for isolating an array of thermal sensors from an underlying integrated circuit substrate. Examples of such thermal isolation structures are shown in U.S. Pat. No. 4,143,269 entitled *Ferroelectric Imaging System* to McCormack, et al., and U.S. Pat. No. 5,047,644 entitled *Polyimide Thermal Isolation Mesa for a Thermal Imaging System* to Meissner, et al., both assigned to Texas Instruments Incorporated, the assignee of this invention.

SUMMARY OF THE INVENTION

In accordance with the present invention, the disadvantages and problems associated with previous focal plane arrays and thermal isolation structures used to mechanically and electrically couple an array of thermal sensors to an integrated circuit substrate have been substantially reduced or eliminated. The present invention allows fabricating a thermal (infrared) imaging system having enhanced thermal isolation by coupling an array of separate, individual thermal sensors with an array of mesa-type structures disposed between the thermal sensors and the integrated circuit substrate.

The present invention improves mechanical and electrical coupling between component structures of a hybrid solid state system by providing relatively robust mesa-type structures for use during bonding of the component structures and multiple electrical conductors between the component structures. The mesa-type structures may be formed on and project from one of the component structures of the hybrid system.

An important technical advantage of the present invention includes improved thermal isolation between adjacent thermal sensors provided by a separate infrared absorber assembly for each thermal sensor and a separate bonding and sensor signal interface between each thermal sensor and an underlying integrated circuit substrate. The present invention results in substantially reduced thermal current flow associated with each thermal sensor.

In one aspect of the present invention, the thermal isolation structure may be used in a thermal imaging system to couple an array of thermal sensors to an integrated circuit substrate having a corresponding array of contact pads on the surface of the integrated circuit substrate adjacent to the mesa-type structures formed between each thermal sensor and the integrated circuit substrate. Each mesa-type structure includes one or more mesa conductors for providing signal paths from the top of each mesa to the associated contact pads. A focal plane array may be disposed over the integrated circuit substrate in contact with the respective mesa-type structures such that, for each thermal sensor, biasing voltage ($V_B$) is coupled through a first mesa conductor from a first contact pad, and the sensor signal output is coupled through a second mesa conductor to a second contact pad. Alternative configurations may include a pair of mesa-type structures formed with sloped sidewalls or vertical sidewalls adjacent to the respective contact pads on the integrated circuit substrate.

Another aspect of the present invention includes a focal plane array of ferroelectric thermal sensors with each thermal sensor having its own infrared absorber assembly, power supply electrode and sensor signal electrode. The focal plane array may be coupled to an integrated circuit substrate by bump-bonding, with bump-bonding conductive material (such as a bump-bonding metal) provided on the top of the mesa-type structures and on each power supply electrode and sensor signal electrode.

Another important technical advantage of the mesa-type structures of the present invention includes providing two electrical conductors from the integrated circuit substrate for each thermal sensor which allows isolation of each thermal sensor from adjacent thermal sensors by eliminating the need for a common power supply electrode between all thermal sensors. The resulting enhanced thermal isolation eliminates inter-pixel conduction and improves the Modulation Transfer Function (MTF). The use of a thermal isolation mesa-type structure along with an infrared absorber assembly incorporating the present invention, allows flexibility in designing the sensor signal flowpath.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a schematic representation of a typical thermal circuit associated with a thermal imaging system or infrared detector having a thermal sensor formed from a ferroelectric element, an integrated circuit substrate and a thermal isolation structure disposed therebetween;

FIG. 2 is a schematic representation of the sensor signal flowpath associated with a thermal sensor incorporating one embodiment of the present invention;

FIG. 3 is a schematic plan view with portions broken away showing an infrared detector having a focal plane array, thermal isolation structure, and integrated circuit substrate incorporating an embodiment of the present invention corresponding with FIG. 2;

FIG. 4 is a drawing in section with portions broken away taken along line 4—4 of FIG. 3;

DETAILED DESCRIPTION OF THE INVENTION

Figure 5:
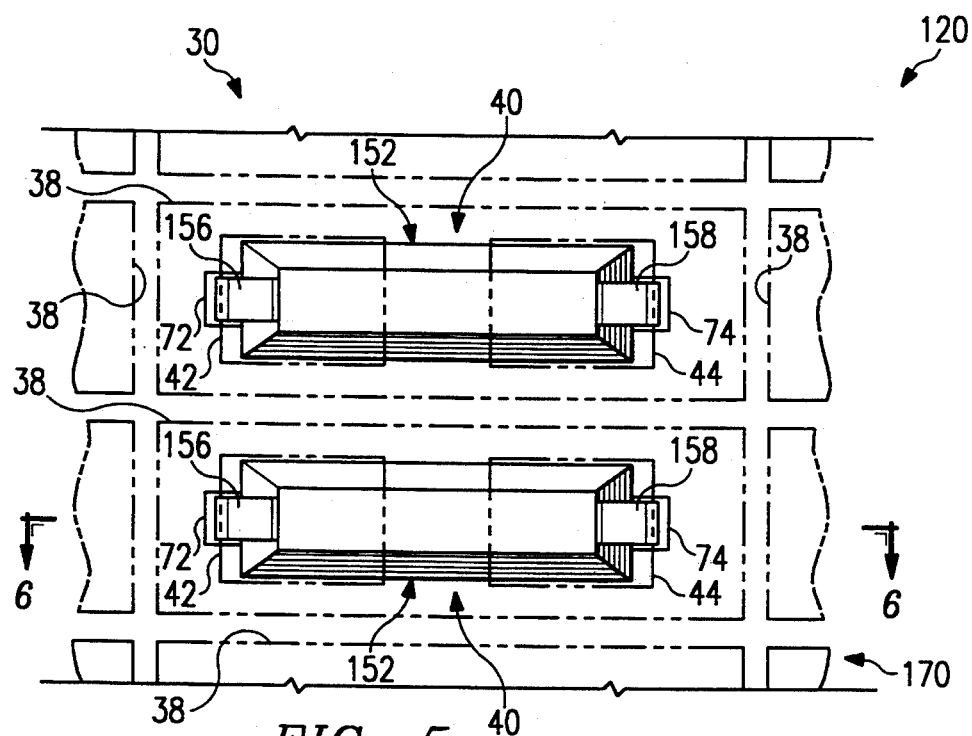
FIG. 5 is a schematic plan view with portions broken away showing an infrared detector having a focal plane array, thermal isolation structure, and integrated circuit substrate incorporating an alternative embodiment of the present invention corresponding with FIG. 2.

The preferred embodiments of the present invention and its advantages are best understood by referring to FIGS. 1-11 of the drawings, like numerals being used for like and corresponding parts of the various drawings.

Infrared detectors or thermal imaging systems are typically based upon either the generation of a change in voltage due to a change in temperature resulting from incident infrared radiation striking a thermal sensor or the generation of a change in voltage due to a photon-electron interaction within the material used to form the thermal sensor. This latter effect is sometimes called the internal photoelectric effect. Thermal imaging systems or infrared detectors 20, 120, 220 and 320, which will be described later in more detail, function based upon the generation of a change in voltage due to a change in temperature of ferroelectric material resulting from incident infrared radiation. Thermal imaging systems 20, 120, 220 and 320 are sometimes referred to as uncooled infrared detectors. The various components of thermal imaging systems 20, 120, 220 and 320 are preferably contained in associated housings (not shown) in a vacuum environment. Also, an inert environment may be satisfactory for some applications.

A thermal isolation structure associated with hybrid solid state systems often comprises two elements—an electrical conductor element and a thermal isolation element. As represented by thermal circuit 90 in FIG. 1, this general configuration for a thermal isolation structure can be represented by a thermal circuit with two parallel thermal current paths, one through a low-thermal-resistivity electrical conductor element and one through a high-thermal-resistivity thermal isolation element. One design goal is to minimize total thermal current flow through these two elements. By forming a focal plane array with discrete infrared absorber assemblies, thermal conduction between adjacent thermal sensors is reduced which improves MTF of the associated thermal imaging system.

Thermal circuit 90 is connected between sensor signal electrode 92 on ferroelectric element 94, and the associated contact pad 96 on integrated circuit substrate 98. A thermal current $i_T$ will flow through thermal circuit 90, in two parallel thermal current paths—an electrical conductor component $i_C$ flows through one or more mesa conductors having thermal resistance 100, and a mesa component $i_M$ which flows through one or more mesa-type structures represented by thermal resistance 102. By maximizing the total thermal resistance of thermal circuit 90, total thermal current $i_T = i_C + i_M$ is minimized.

Examples of previous thermal isolation structures are shown in U.S. Pat. No. 5,047,644 entitled *Polyimide Thermal Isolation Mesa for a Thermal Imaging System* to Meissner, et al. The fabrication techniques and the materials used in U.S. Pat. No. 5,047,644 may be used in fabricating thermal isolation structures 50 and 150 of the present invention. U.S. Pat. No. 5,047,644 is incorporated by reference for all purposes in this patent application.

Various types of semiconductor materials and integrated circuit substrates may also be satisfactorily used with the present invention. U.S. Pat. No. 4,143,269 entitled *Ferroelectric Imaging System* provides information concerning infrared detectors fabricated from ferroelectric materials and a silicone switching matrix or integrated circuit substrate. U.S. Pat. No. 4,143,269 is incorporated by reference for all purposes in this patent application.

Thermal imaging system 20 and related fabrication methods will be described in detail. Thermal imaging systems 120, 220 and 320 represent alternative embodiments of the present invention. Various components may be alternatively used in each thermal imaging system 20, 120, 220 and 320. The written description of thermal imaging systems 120, 220 and 320 will be limited to describing differences between the respective thermal imaging system and thermal imaging system 20, including variations in their respective method of fabrication.

Figure 7:
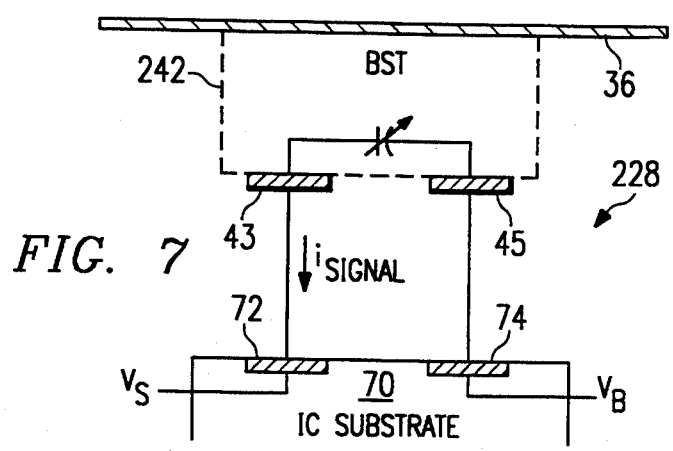
FIG. 7 is a schematic representation of the sensor signal flowpath associated with a thermal sensor incorporating another embodiment of the present invention.

FIG. 2 is a schematic representation of a sensor signal flowpath associated with one embodiment of the present invention such as thermal imaging systems 20 and 120. FIG. 7 is a schematic representation of a sensor signal flowpath associated with another embodiment of the present invention such as thermal imaging systems 220 and 320. Infrared absorber assembly 32 incorporating the present invention may be used with each thermal imaging system 20, 120, 220 and 320. Thermal imaging systems 20 and 120 have the same focal plane array 30 including a plurality of infrared absorber assemblies 32 with a pair of ferroelectric elements 42 and 44 coupled respectively to each infrared absorber assembly 32. Thermal imaging systems 220 and 320 have the same focal plane array 230 including a plurality of infrared absorber assemblies 32 with ferroelectric elements 242 coupled respectively to each infrared absorber assembly 32. Thermal imaging systems 20 and 220 have the same thermal isolation structure 50 including mesa-type structures 52 and 54 projecting from the same integrated circuit substrate 70. Thermal imaging systems 120 and 320 have the same thermal isolation structure 150 including mesa-type structures 152 projecting from the same integrated circuit substrate 170.

A schematic drawing showing sensor signal flowpath or electrical circuit 28 associated with one embodiment of the present invention is shown in FIG. 2. The principal components of sensor signal flowpath 28 include a pair of contact pads 72 and 74 on integrated circuit substrate 70 and ferroelectric elements 42 and 44 with their respective electrodes 43 and 45 and metal plate 36 extending across both ferroelectric elements 42 and 44.

Integrated circuit substrate 70 supplies bias voltage or biasing voltage ($V_B$) to first contact pad or power supply pad 74 which flows to first electrode or power supply electrode 45. Incident infrared radiation will cause a temperature change in ferroelectric elements 42 and 44 resulting in a change in capacitance and polarization between metal plate 36 and electrodes 43 and 45, respectively. A signal corresponding to the incident infrared radiation will flow from ferroelectric element 42 through metal plate 36 to ferroelectric element 44. From ferroelectric element 44 the signal will flow from second electrode or sensor signal electrode 43 to second contact pad 72 on integrated circuit substrate 70. The sensor signal ($V_S$) is a function of the change in capacitance and polarization of ferroelectric elements 42 and 44 resulting from the incident infrared radiation. Therefore, ferroelectric elements 42 and 44 may be represented in sensor signal flowpath 28 as a pair of variable capacitors connected by metal plate 36. Thermal imaging systems 20 and 120 have similar sensor signal flowpaths which corresponds generally with the schematic circuit shown in FIG. 2.

Some of the principal components or structures which comprise thermal imaging system 20, as shown in FIGS. 3 and 4, include focal plane array 30, thermal isolation structure 50, and integrated circuit substrate 70. Focal plane array 30 comprises a plurality of thermal sensors 40. The quantity and location of thermal sensors 40 will depend upon the desired N×M configuration for focal plane array 30.

Thermal isolation structure 50 is used to provide mechanical support during bonding of focal plane array 30 with integrated circuit substrate 70 and to thermally insulate focal plane array 30 from integrated circuit substrate 70. For some embodiments of the present invention, thermal isolation structure 50 may be used to support focal plane array 30 during formation of separate infrared absorber assemblies 32 associated with each thermal sensor 40. Also, thermal isolation structure 50 provides an electrical interface between each thermal sensor 40 in focal plane array 30 and integrated circuit substrate 70. The electrical interface allows integrated circuit substrate 70 to supply power to each thermal sensor 40 and to process thermal images based on incident infrared radiation detected by focal plane array 30.

Thermal imaging system 20 will produce a thermal image in response to incident infrared radiation striking focal plane array 30. The components of focal plane array 30 include a plurality of thermal sensors 40 and their respective infrared absorber assembly 32. Each thermal sensor 40 further comprises a pair of ferroelectric elements 42 and 44 with sensor signal electrode 43 and power supply electrode 45 respectively. One side of both ferroelectric elements 42 and 44 is attached to their associated infrared absorber assembly 32. Electrodes 43 and 45 are attached to the opposite side of their respective ferroelectric elements 42 and 44. Ferroelectric elements 42 and 44 may be formed from a suitable ferroelectric material, such as BST (barium-strontium-titanate).

Incident infrared radiation will interact with infrared absorber assemblies 32 and produce a temperature change in the attached ferroelectric elements 42 and 44. The temperature change will vary the electrical polarization and capacitance of the respective ferroelectric elements 42 and 44. The representative thermal image signal ($V_S$) appearing at each sensor signal electrode 43 will depend upon the polarization and capacitance of the associated ferroelectric elements 42 and 44, which in turn is a function of the incident infrared radiation. Ferroelectric elements 42 and 44 of focal plane array 30 are isolated thermally from adjacent thermal sensors 40 and from integrated circuit substrate 70 to insure that the capacitance and polarization associated with each thermal sensor 40 accurately represents the incident infrared radiation.

Each thermal sensor 40 in focal plane array 30 is individually coupled with integrated circuit substrate 70 by a pair of mesa-type structures 52 and 54 provided by thermal isolation structure 50. Each thermal sensor 40 is preferably connected electrically through its associated mesa-type structures 52 and 54 to a pair of corresponding contact pads 72 and 74 on integrated circuit substrate 70.

The thermal current flow through a material depends upon the thermal conductivity of the material and the volume of material (thermal capacitance). The size of each mesa-type structure 52 and 54 will be dictated primarily by structural and thermal capacitance considerations. Since mesa-type structures 52 and 54 exhibit very low thermal conductivity (i.e., very high thermal resistivity), the thermal-current mesa component $i_M$ through mesa-type structures 52 and 54 will typically depend upon structural requirements that determine the minimum allowable size of each mesa-type structure 52 and 54.

Mesa strip conductors 56 and 58 which provide a portion of the sensor signal flowpath will inevitably exhibit a relatively low electrical resistivity and relatively high thermal conductivity. Accordingly, to increase the total thermal resistance provided by mesa strip conductors 56 and 58 and to minimize the corresponding thermal current conductor component $i_C$, mesa strip conductors 56 and 58 should be configured with as small a cross sectional area to length ratio as possible.

The recommended design approach is to first specify structural, sensor signal flowpath and thermal isolation requirements for thermal isolation structure 50, which will determine its total area and volume. Next the configuration for mesa-type structures 52 and 54 is selected and the associated thermal resistance established along with the corresponding thermal-current mesa component $i_M$. Once this thermal current component is established, a configuration for mesa strip conductors 56 and 58 may be selected to achieve an overall thermal resistance that meets the thermal isolation requirements for thermal imaging system 20. Design selection is typically a reiterative process during which the configuration of mesa-type structures 52 and 54 and mesa strip conductors 56 and 58 are varied to produce the desired structural integrity, sensor signal flowpath, and thermal isolation.

As shown in FIGS. 3 and 4, integrated circuit substrate 70 includes a corresponding array of contact pads 72 and 74. Thermal isolation structure 50 comprises an array of mesa-type structures 52 and 54, formed on integrated circuit substrate 70 adjacent to respective pairs of contact pads 72 and 74. Each thermal sensor 40 is preferably provided with the same bias voltage ($V_B$). Therefore, one or more common bus bars 76 may be formed on the surface of integrated circuit substrate 70 with a plurality of contact pads 74 positioned adjacent to each mesa-type structure 54. Contact pad 74, mesa-strip conductor 58 and power supply electrode 48 cooperate to supply bias voltage ($V_B$) to the associated ferroelectric element 44.

Each infrared absorber assembly 32 comprises a layer of infrared absorber or optical coating 34 formed from infrared absorbing material and metal or reflective plate 36. Plate 36 performs several important functions including supporting the associated layer of optical coating 34 and reflecting incident infrared radiation to increase the interaction with optical coating 34. Plate 36 also forms a portion of the sensor signal flowpath between ferroelectric elements 42 and 44.

For one embodiment of the present invention, plate 36 may be formed from metal which has both good thermal and electrical conductivity along with high reflectivity of incident infrared radiation. For other embodiments of the present invention, materials other than metal which have the desired characteristics may be used to form plate 36. The present invention is not limited to use with only metal plates 36.

Metallic bonding material 46 is preferably provided on sensor signal electrode 43 to form a bump bond with similar metallic bonding material 62 on associated mesa-type structure 52. In a similar manner metallic bonding material 48 is preferably provided on power supply electrode 45 for bump bonding with metallic bonding material 64 on mesa-type structure 54. For some applications, epoxy bonding may be satisfactorily used to mount thermal sensors 40 on their associated mesa-type structures 52 and 54.

For each thermal sensor 40, ferroelectric elements 42 and 44, infrared absorber assembly 32 and the respective electrodes 43 and 45 define a ferroelectric transducer. That is, power supply electrode 45 and sensor signal electrode 43 constitute capacitor plates, while ferroelectric elements 42 and 44 constitute dielectrics electrically coupled to each other by metal plate 36 of infrared absorber assembly 32. The resulting capacitance and polarization is temperature-dependent, implementing a ferroelectric (or pyroelectric) transducer function. The associated Modulation Transfer Function (MTF) is substantially enhanced by thermal isolation structure 50 and infrared absorber assembly 32 incorporating the present invention.

For each thermal sensor 40, thermal (infrared) radiation incident to focal plane array 30 is absorbed by the respective infrared absorber or optical coating 34 and transmitted as heat through metal plate 36 into the adjacent ferroelectric elements 42 and 44. The resulting temperature change in the ferroelectric elements 42 and 44 causes a change in the state of electrical polarization and capacitance. The corresponding sensor signal output available from the sensor signal electrode 43 depends upon the capacitance and polarization of the respective ferroelectric transducer (i.e., thermal sensor 40).

Integrated circuit substrate 70 comprises a conventional switching matrix and associated series of amplifiers. Integrated circuit substrate 70 is bonded to focal plane array 30, with each pair of contact pads 72 and 74 being electrically connected to the corresponding sensor signal electrode 43 and power supply electrode 45 of an associated thermal sensor 40. Thermal isolation structure 50 prevents the integrated circuit substrate 70 from acting as a heat sink for the thermal energy stored in ferroelectric elements 42 and 44 of each thermal sensor 40 and adversely affecting the associated transducer capacitance and sensor signal accuracy.

Mesa strip conductor 56 provides a signal path between the top of each mesa-type structure 52 and the adjacent contact pad 72. Mesa strip conductor 58 provides an electrical path from the adjacent contact pad 74 to the top of each mesa-type structure 54. Recommended materials for the mesa strip conductors 56 and 58 include titanium and tungsten alloys because of their relatively low thermal conductivity and ease of application.

Indium bump bonding techniques may be satisfactorily used to form metal bonds between focal plane array 30 and thermal isolation structure 50. The configurations of mesa-type structures 52 and 54 and the associated mesa strip conductors 56 and 58 are design choices, largely dependent upon thermal isolation and structural rigidity considerations. Alternative configurations for mesas 52 and 54 include mesas with sloping sidewalls and mesas with vertical sidewalls. For sloped sidewall mesas 52 and 54, a mesa strip configuration for the conductors 56 and 58 is recommended. For a vertical sidewall mesa, a mesa-contour configuration as shown in U.S. Pat. No. 5,047,644 may be more appropriate. These configurations are exemplary only, and other configurations for both the mesa-type structures 52 and 54 and their associated conductors 56 and 58 will be apparent to those skilled in the art. In particular, while mesa-type structures 52 and 54 are shown as symmetrical in horizontal and vertical cross section, such symmetry is not required.

Mesa-type structures 52 and 54 of the present invention, including the exemplary thermal isolation structure 50 for thermal imaging systems 20 and 220, may be fabricated using conventional photolithographic techniques. Fabrication methods using photosensitive polyimide are described. However, for some applications, non-photosensitive polyimide may be used. Fabrication using photosensitive polyimide is recommended, because it generally requires fewer process steps.

One fabrication method is to use photosensitive polyimide, forming the mesa structures by patterning a layer of photoresist on polyimide, and then developing the polyimide to remove the unexposed portions, leaving the polyimide portion of the mesa structure with the desired configuration and array. The mesa conductors may then be formed in conventional metal deposition procedures on the exterior of the polyimide structure.

Once the array of mesa-type structures 52 and 54 have been defined, the selected mesa strip conductors 56 and 58 are formed using conventional photolithography techniques on the exterior of the respective mesas 52 and 54. Mesa strip conductors 56 and 58 are preferably formed on the exterior of their respective mesa-type structures 52 and 54 to extend from the top of the respective mesa-type structure 52 and 54 to the respective contact pads 72 and 74.

Additional fabrication steps may be employed to deposit bump-bond metals 62 and 64 or conductive epoxies (not shown) on the top of mesa-type structures 52 and 54 as desired. These additional fabrication steps are accomplished conventionally, with conventional materials the selection of which depends upon the specific application for thermal isolation structure 50 of the present invention.

Focal plane array 30 may be bonded to integrated circuit substrate 70 by using bump bonding or other conventional techniques to mount thermal sensors 40 on thermal isolation structure 50. During this bonding process, mesa-type structures 52 and 54 provide the necessary mechanical support for the selected bonding process. Following the bonding of focal plane array 30 with integrated circuit substrate 70, various techniques may be used to form a plurality of slots 38 around the perimeter of each infrared absorber assembly 32. For some applications, slots 38 may be formed prior to bump bonding focal plane array 30 with integrated circuit substrate 70.

Slots 38 form void spaces between adjacent infrared absorber assemblies 32 which prevent the transfer of thermal energy from adjacent thermal sensors 40 through infrared absorber assembly 32. Slots 38 substantially enhance the thermal isolation of each thermal sensor 40 particularly when the associated thermal imaging system is disposed in a vacuum or low thermal conductivity gas environment. Slots 38 may be formed by photolithography or other techniques associated with fabrication of semiconductor devices.

Figure 6:
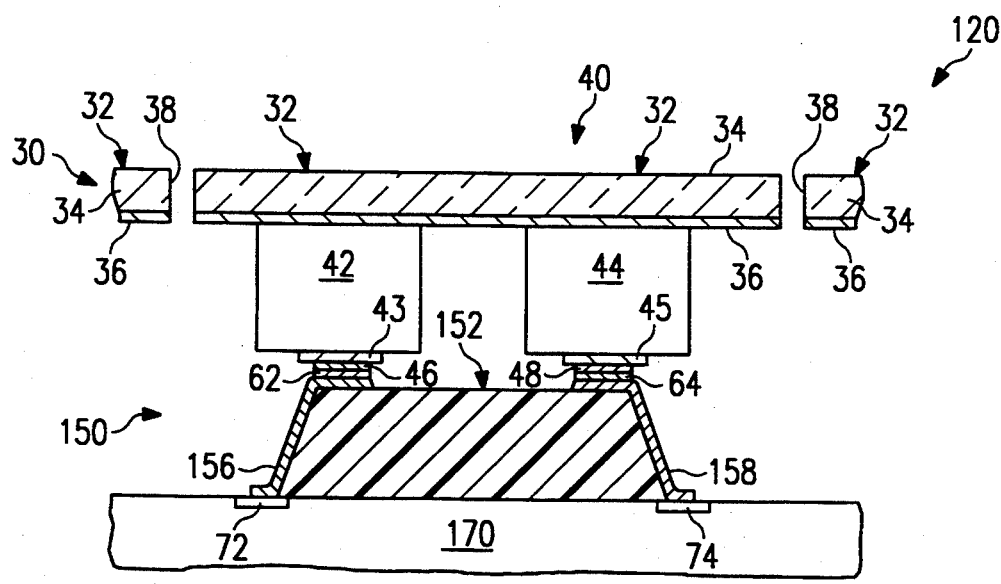
FIG. 6 is a drawing in section with portions broken away taken along lines 6—6 of FIG. 5.

FIGS. 5 and 6 illustrate an alternative embodiment of the present invention in which thermal imaging system 120 comprises focal plane array 30, thermal isolation structure 150 and integrated circuit substrate 170. As previously noted for thermal imaging system 20, the various components of thermal imaging system 120 are preferably disposed in a vacuum or low thermal conductivity gas environment.

Thermal isolation structure 150 is provided to mount thermal sensors 40 of focal plane array 30 on integrated circuit substrate 170. Thermal isolation structure 150 includes a plurality of mesa-type structures 152 which may be coupled with their respective thermal sensor 40. For selected applications forming a single mesa-type structure 152 may be more cost effective as compared to forming a pair of mesa-type structures 52 and 54. As previously noted, designing a focal plane array, ferroelectric elements and a thermal isolation structure is typically a reiterative process. Thermal isolation structure 150 with mesa-type structures 152 is formed in a manner similar to thermal isolation structure 50.

Mesa strip conductors 156 and 158 are formed on the exterior of mesa-type structure 152 adjacent to the associated pair of contact pads 72 and 74. Integrated circuit substrate 170 is similar to integrated circuit substrate 70 except common bus bars 76 have been eliminated. By providing an array of individual power supply contact pad 74, integrated circuit substrate 170 allows the option of varying the bias voltage ($V_B$) supplied to each thermal sensor 40. As previously noted, normally the same bias voltage ($V_B$) is provided to each thermal sensor 40. However, for some applications particularly very large arrays, it may be desirable to vary the bias voltage ($V_B$) supplied to each thermal sensor 40.

Integrated circuit substrate 170 provides two electrical contact pads 72 and 74. A pair of mesa strip conductors 156 and 158 are provided on each mesa-type structure 152. Mesa strip conductor 158 provides bias voltage ($V_B$) from contact pad 74 to allow ferroelectric elements 42 and 44 and electrodes 43 and 45 to function as a capacitor.

Figure 6A:
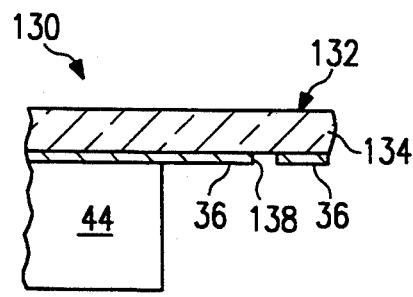
FIG. 6a is a schematic representation with portions broken away showing a focal plane array incorporating a further embodiment of the present invention.

A further embodiment of the present invention is represented by focal plane array 130 having infrared absorber assembly 132 as shown in FIG. 6a. Infrared absorber assembly 132 comprises a layer of infrared absorber or optical coating 134 which extends across the full surface of focal plane array 130. A plurality of metal plates 36 are disposed between and attached to infrared absorber layer 134 and the respective ferroelectric elements 42 and 44 as previously shown in FIGS. 4 and 6. Slots 138 are provided between each adjacent metal plate 36. However, slots 138 do not extend through infrared absorber layer 134. One of the principal differences between infrared absorber assembly 32 and infrared absorber assembly 132 is slots 138 provided between adjacent plates 36 but not extending through infrared absorber layer 134. Focal plane array 130 with infrared absorber assembly 132 may be used in fabricating thermal imaging systems 20, 120, 220, and 320 as desired. Since slots 138 are only formed between adjacent metal plates 36 there may be some additional thermal current flow through infrared absorber layer 134 as compared to the thermal current flow associated with infrared absorber assemblies 32 and their respective infrared absorber layer 34.

A schematic drawing showing sensor signal flowpath or electrical circuit 228 associated with another embodiment of the present invention is shown in FIG. 7. The principal components of sensor signal flowpath 228 include a pair of contact pads 72 and 74 on integrated circuit substrate 70 and ferroelectric element 242 with sensor signal electrode 43 and power supply electrode 45. Integrated circuit substrate 70 supplies bias voltage ($V_B$) to first contact pad or power supply pad 74 which flows to first electrode or power supply electrode 45. For some applications of the present invention, metal plate 36 may form a portion of the sensor signal flow path between electrodes 43 and 45. For other applications, plate 36 may be formed from non-conductive material or even eliminated which results in only ferroelectric element 242 providing a signal flow path between the associated electrodes 43 and 45.

Incident infrared radiation will cause a temperature change in ferroelectric element 242 resulting in a change in polarization and capacitance between electrodes 43 and 45. A signal corresponding to the incident infrared radiation will flow from second electrode or sensor signal electrode 43 to second contact pad 72 on integrated circuit substrate 70. The sensor signal ($V_S$) is a function of the change in polarization and capacitance of ferroelectric element 242 resulting from the incident infrared radiation. Therefore, ferroelectric element 242 may be represented as a variable capacitor in sensor signal flowpath 228. Thermal imaging systems 220 and 320 have similar sensor signal flowpaths which correspond generally with the schematic circuit shown in FIG. 7.

Some of the principal components or structures which comprise thermal imaging system 220 include focal plane array 230, thermal isolation structure 50, and integrated circuit substrate 70. Focal plane array 230 comprises a plurality of thermal sensors 240. The quantity and location of thermal sensors 240 will depend upon the desired $N \times M$ configuration for focal plane array 230. Thermal isolation structure 50 and integrated circuit substrate 70 are essentially the same as previously described for thermal imaging system 20.

Thermal isolation structure 50 provides an electrical interface between each thermal sensor 240 in focal plane array 230 and integrated circuit substrate 70. The electrical interface allows integrated circuit substrate 70 to supply power to each thermal sensor 240 and to process thermal images based on incident infrared radiation detected by focal plane array 230.

Figure 8:
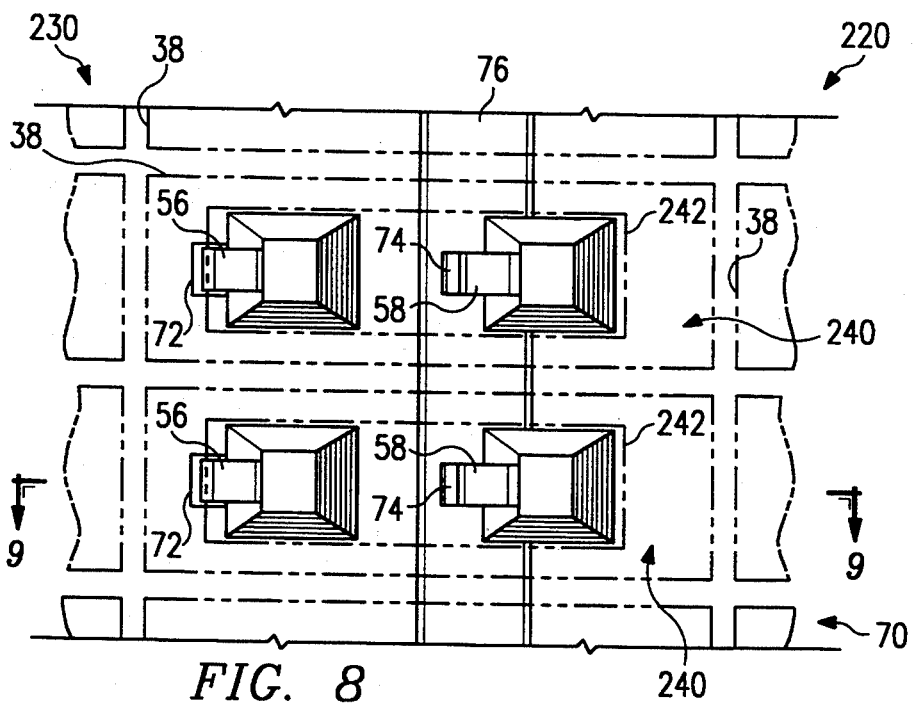
FIG. 8 is a schematic plan view with portions broken away showing an infrared detector having a focal plane array, thermal isolation structure, and integrated circuit substrate incorporating an embodiment of the present invention corresponding generally with FIG. 7.
Figure 9:
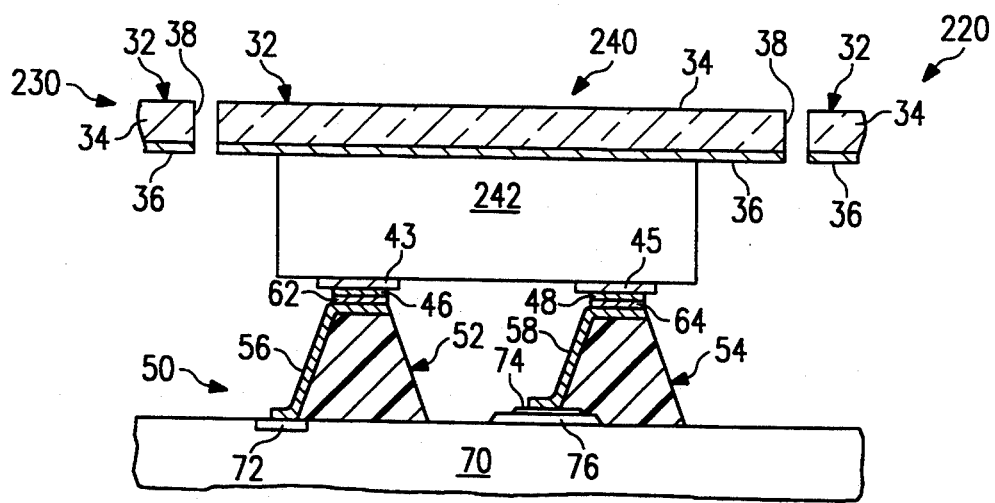
FIG. 9 is a drawing in section with portions broken away taken along line 9—9 of FIG. 8.

Thermal imaging system 220, as shown in FIGS. 8 and 9, will produce a thermal image in response to incident infrared radiation striking focal plane array 230. The components of focal plane array 230 include a plurality of thermal sensors 240 and their respective infrared absorber assembly 32. Each thermal sensor 240 further comprises a single ferroelectric element 242 with sensor signal electrode 43 and power supply electrode 45 respectively. One side of each ferroelectric element 242 is attached to the associated infrared absorber assembly 32. Electrodes 43 and 45 are attached to the opposite side of each ferroelectric element 242 and spaced apart from each other. Ferroelectric elements 242 may be formed from a suitable ferroelectric material, such as BST (barium-strontium-titanate). For some applications it may be more cost effective to form a single ferroelectric element 242 as compared to a pair of ferroelectric elements 42 and 44.

Incident infrared radiation will produce a temperature change in each ferroelectric element 242 which changes its electrical polarization and capacitance. The representative thermal image signal appearing on each sensor signal electrode 43 will depend upon the polarization and capacitance of the associated ferroelectric element 242, which in turn is a function of the incident infrared radiation. Ferroelectric element 242 of focal plane array 230 are isolated thermally from adjacent thermal sensors 240 and from integrated circuit substrate 70 to insure that the polarization and capacitance associated with each thermal sensor 240 accurately represents the incident infrared radiation.

Each thermal sensor 240 in the focal plane array 230 is coupled with integrated circuit substrate 70 by a pair of mesa-type structures 52 and 54 provided by thermal isolation structure 50. Each thermal sensor 240 is preferably connected electrically through its associated mesa-type structures 52 and 54 to corresponding contact pads 72 and 74 on integrated circuit substrate 70. Mesa strip conductors 56 and 58 provide a portion of the sensor signal flowpath and function as previously described for thermal imaging system 20. The configuration of mesa strip conductors 56 and 58 may be selected to achieve an overall thermal resistance that meets the thermal isolation requirements for thermal imaging system 220. As previously noted, design selection is typically a reiterative process during which the configuration of mesa-type structures 52 and 54 and mesa strip conductors 56 and 58 are varied to produce the desired structural integrity, sensor signal flowpath, and thermal isolation.

For each thermal sensor 240, ferroelectric element 242, infrared absorber assembly 32 and the respective electrodes 43 and 45 define a ferroelectric transducer. That is, power supply electrode 45 and sensor signal electrode 43 constitute capacitor plates, while ferroelectric element 242 constitutes a dielectric. The resulting capacitance and polarization are temperature-dependent, implementing a ferroelectric (or pyroelectric) transducer function. The associated MTF is substantially enhanced by thermal isolation structure 50 and infrared absorber assembly 32 incorporating the present invention.

For each thermal sensor 240, thermal (infrared) radiation incident to focal plane array 230 is absorbed by the respective infrared absorber or optical coating 34 and transmitted as heat through metal plate 36 into the adjacent ferroelectric element 242. The resulting temperature change in the ferroelectric element 242 causes a change in the state of electrical polarization and capacitance. The corresponding sensor signal output available from the sensor signal electrode 43 depends upon the capacitance and polarization of the respective ferroelectric transducer (i.e., thermal sensor 240).

Integrated circuit substrate 70 is bonded to focal plane array 230, with each pair of contact pads 72 and 74 being electrically connected to the corresponding sensor signal electrode 43 and power supply electrode 45 of an associated thermal sensor 240. Thermal isolation structure 50 prevents integrated circuit substrate 70 from acting as a heat sink for the thermal energy stored in ferroelectric element 242 of each thermal sensor 40 and adversely affecting the associated transducer capacitance and sensor signal accuracy.

Figure 10:
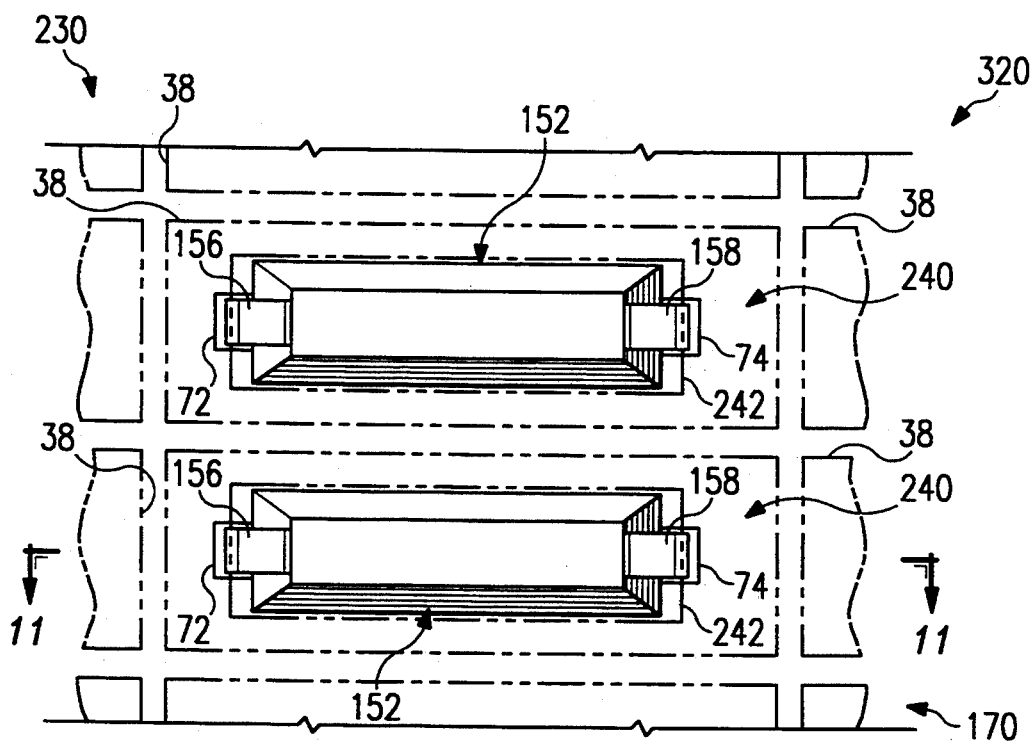
FIG. 10 is a schematic plan view with portions broken away showing an infrared detector having a focal plane array, thermal isolation structure, and integrated circuit substrate incorporating an alternative embodiment of the present invention corresponding with FIG. 7.
Figure 11:
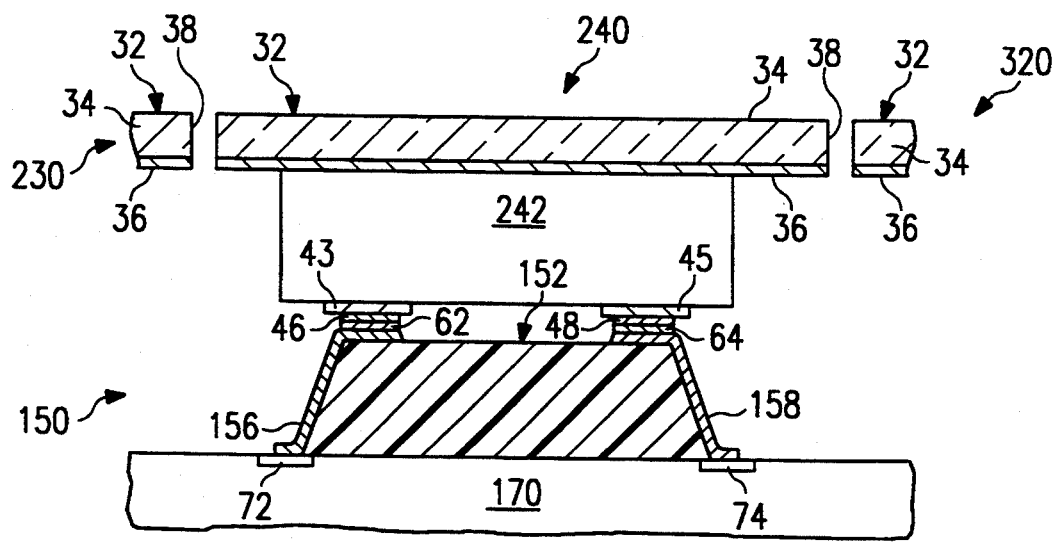
FIG. 11 is a drawing in section with portions broken away taken along lines 11—11 of FIG. 10.

As shown in FIGS. 10 and 11, thermal imaging system 320 includes focal plane array 230 of individual thermal sensors or infrared detector elements 240, together with thermal isolation structure 150 and integrated circuit substrate 170. Thermal isolation structure 150 comprises an array of mesa-type structure 152, formed on integrated circuit substrate 170 adjacent to respective pairs of contact pads 72 and 74. Thermal isolation structure 150 provides mechanical support during bonding of focal plane array 230 with integrated circuit substrate 170, electrical connections between each thermal sensor 240 and its associated contact pads 72 and 74 and thermal isolation between each thermal sensor 240 and integrated circuit substrate 170.

The precise structural configuration, and associated fabrication methods for ferroelectric elements 42, 44 and 142 and mesa-type structures 52, 54 and 152 in accordance with the present invention are dependent upon the application chosen for the resulting thermal sensor 40 and 240. Even within a particular application, such as the exemplary thermal imaging systems 20, 120, 220 and 320, numerous design choices will be routinely implemented by those skilled in the art.

Thermal imaging systems 20, 120, 220 and 320 are examples of hybrid solid state systems with component structures and substrates electrically and mechanically coupled to each other. The present invention may be used to provide thermal isolation and/or electrical connections for various types of hybrid solid state systems in addition to thermal imaging systems. A mesa-type structure incorporating the present invention may be satisfactorily used to attach various substrates during fabrication of a wide variety of electronic devices.

Although the present invention and its advantages have been described in detail, it should be understood that various changes, substitutions and alterations can be made therein without departing from the spirit and scope of the invention as defined by the appended claims.

What is claimed is:

1. An infrared detector including a focal plane array and an integrated circuit substrate, comprising:
 a plurality of thermal sensors for providing a sensor signal output representative of the amount of thermal radiation incident to the focal plane array;
 a respective infrared absorber assembly coupled to one side of each thermal sensor and the integrated circuit substrate coupled to the opposite side of each thermal sensor;
 a plurality of slots formed in the focal plane array extending between each infrared absorber assembly and adjacent thermal sensors;
 an array of contact pads, disposed on the integrated circuit substrate, for receiving the sensor signal output from the respective thermal sensors; and
 a thermal isolation structure formed by a plurality of mesa-type structures projecting from the integrated circuit substrate for coupling the thermal sensors with the integrated circuit substrate, wherein each mesa-type structure is adjacent to one or more of the respective contact pads.

2. The detector of claim 1, wherein the focal plane array further comprises:
 each thermal sensor having a ferroelectric element;
 the respective infrared absorber assembly attached to one side of each ferroelectric element; and
 a power supply electrode and a sensor signal electrode attached to the opposite side of each ferroelectric element.

3. The detector of claim 1, wherein the focal plane array further comprises:
 each thermal sensor having a pair of ferroelectric elements;
 the respective infrared absorber assembly attached to one side of both ferroelectric elements;
 a power supply electrode attached to the opposite side of one ferroelectric element of each thermal sensor; and
 a sensor signal electrode attached to the opposite side of the other ferroelectric element of each thermal sensor.

4. The detector of claim 1, wherein the focal plane array further comprises:
 each thermal sensor having a pair of ferroelectric elements;
 the respective infrared absorber assembly attached to one side of both ferroelectric elements;
 a power supply electrode attached to the opposite side of one ferroelectric element of each thermal sensor;
 a sensor signal electrode attached to the opposite side of the other ferroelectric element of each thermal sensor; and
 the opposite side of each ferroelectric element coupled with a respective mesa-type structure.

5. The detector of claim 1, wherein the focal plane array further comprises:
 each thermal sensor having a ferroelectric element;
 the respective infrared absorber assembly attached to one side of each ferroelectric element;
 a power supply electrode and a sensor signal electrode attached to the opposite side of each ferroelectric element; and
 each electrode coupled with a respective mesa-type structure.

6. The detector of claim 1, wherein the focal plane array further comprises:
 each infrared absorber assembly having a layer of optical coating sensitive to infrared radiation disposed on a layer of reflective material;
 each thermal sensor having at least one ferroelectric element with the respective infrared absorber assembly coupled with one side of each ferroelectric element and at least one electrode coupled with the opposite side of the respective ferroelectric element; and
 a plurality of slots extending through the layer of optical coating and the layer of reflective material between each infrared absorber assembly.

7. The detector of claim 1, wherein the thermal isolation structure further comprises:
 a first mesa-type structure disposed adjacent to a first contact pad;
 a second mesa-type structure disposed adjacent to a second contact pad; and
 a mesa conductor disposed on the exterior of each mesa-type structure extending from the top of each mesa-type structure to the respective contact pad.

8. The detector of claim 1, wherein the array of thermal sensors further comprises:
 a plurality of ferroelectric thermal sensors with one side of each ferroelectric thermal sensor coupled to the respective infrared absorber assembly and an electrode disposed on the opposite side of the respective ferroelectric thermal sensor; and
 each infrared absorber assembly separated from adjacent infrared absorber and reflective plate assemblies by the plurality of slots.

9. The detector of claim 1, wherein each thermal sensor further comprises:
 the respective infrared absorber assembly having a layer of optical coating sensitive to infrared radiation disposed on a metal plate;
 a pair of ferroelectric elements with one side of both ferroelectric elements coupled with the metal plate;
 a power supply electrode coupled with the opposite side of one ferroelectric element;
 a sensor signal electrode coupled with the opposite side of the other ferroelectric element; and
 the metal plate providing an electrical connection between the respective ferroelectric elements.

10. A focal plane array, comprising:
 an array of thermal sensors for detecting incident thermal radiation, each thermal sensor providing a sensor signal output representative of the amount of the thermal radiation incident to the respective thermal sensor and each thermal sensor isolated electrically and thermally from adjacent thermal sensors;
 an integrated circuit substrate having an array of contact pads disposed on a substantially planar surface for supplying power to each thermal sensor and receiving the sensor signal output from the respective thermal sensor;

an array of mesa-type structures projecting from the substantially planar surface of the integrated circuit substrate, at least one mesa-type structure being disposed adjacent to each contact pad;

a first mesa conductor for supplying power to each thermal sensor from a corresponding first contact pad;

a second mesa conductor for providing a signal flow-path between each thermal sensor and a corresponding second contact pad;

each mesa conductor extending from the top of the respective mesa-type structure to the adjacent area of the integrated circuit substrate having the corresponding contact pad; and the thermal sensor array being disposed over the integrated circuit substrate in contact with the array of mesa-type structures such that, the power supply for each thermal sensor is coupled from the corresponding first contact pad through the respective first mesa conductor and the sensor signal output is coupled through the respective second mesa conductor to the corresponding second contact pad.

11. The focal plane array of claim 10, wherein the array of thermal sensors further comprises:
an array of individual thermal sensors, with each thermal sensor coupled to a respective infrared absorber assembly; and
a plurality of slots extending between each infrared absorber assembly and adjacent thermal sensors.

12. The focal plane array of claim 10, wherein the array of thermal sensors further comprises:
an infrared absorber assembly having a layer of optical coating sensitive to infrared radiation disposed on a layer of reflective material;
each thermal sensor having at least one ferroelectric element with the infrared absorber assembly coupled with one side of each ferroelectric element; and
an electrode coupled with the opposite side of each ferroelectric element.

13. The focal plane array of claim 10, wherein the array of mesa-type structures further comprises:
a first mesa-type structure disposed adjacent to the first contact pad;
a second mesa-type structure disposed adjacent to the second contact pad; and
a mesa conductor disposed on a portion of the exterior of each mesa-type structure.

14. The focal plane array of claim 10, wherein the array of thermal sensors further comprises:
a plurality of ferroelectric thermal sensors coupled with an infrared absorber assembly disposed on one side of each ferroelectric thermal sensor and an electrode disposed on the opposite side of the respective ferroelectric thermal sensor; and
each infrared absorber assembly separated from adjacent infrared absorber assemblies.

15. The focal plane array of claim 10, wherein the array of thermal sensors further comprises:
an infrared absorber assembly having a layer of optical coating sensitive to infrared radiation disposed on a layer of reflective material;
each thermal sensor having at least one ferroelectric element with the infrared absorber assembly coupled with one side of the ferroelectric element and an electrode coupled with the opposite side of each ferroelectric element;
a bias voltage electrode coupled with one side of each ferroelectric element opposite from the sensor signal electrode; and
each infrared absorber assembly separated from adjacent infrared absorber plate assemblies.

16. A method of fabricating a thermal imaging system having a focal plane array mounted on an integrated circuit substrate with a thermal isolating structure disposed therebetween, comprising the steps of:
forming the focal plane array from a plurality of thermal sensors which provide a sensor signal output representative of the thermal radiation incident to the focal plane array;
providing an integrated circuit substrate with an array of first contact pads for supplying power to the respective thermal sensor;
providing the integrated circuit substrate with an array of second contact pads for receiving the sensor signal output from the respective thermal sensors;
forming a plurality of mesa-type structures projecting from the integrated circuit substrate to provide a portion of the thermal isolation structure, wherein each mesa-type structure is adjacent to one or more of the respective contact pads; and
mounting the focal plane array on the thermal isolation structure.

17. The method of fabricating the thermal imaging system as defined in claim 16, further comprising the step of forming a plurality of slots extending through the focal plane array intermediate the respective thermal sensors.

18. The method of fabricating the thermal imaging system as defined in claim 16, further comprising the steps of:
forming the mesa-type structures with a plurality of polyimide mesas;
mounting the focal plane array on the mesa-type structures; and
forming a plurality of slots in the focal plane array intermediate each thermal sensor.

19. The method of fabricating the thermal imaging system as defined in claim 16, further comprising the steps of:
forming each thermal sensor from a pair of ferroelectric elements; and
coupling each ferroelectric element with a respective mesa-type structure.

20. The method of fabricating the thermal imaging system as defined in claim 16, further comprising the steps of:
forming each thermal sensor with one ferroelectric element;
placing a first electrode on each ferroelectric element for receiving power from the integrated circuit substrate;
placing a second electrode on each ferroelectric element for supplying a sensor signal output to the integrated circuit substrate; and
coupling each electrode with a respective mesa-type structure.

* * * * *